(12) United States Patent
Quinnell et al.

(10) Patent No.: US 8,988,108 B2
(45) Date of Patent: Mar. 24, 2015

(54) COARSE GATING OF CLOCK TREE ELEMENTS

(71) Applicant: Advanced Micro Devices, Inc., Sunnyvale, CA (US)

(72) Inventors: Eric Quinnell, Austin, TX (US); Christopher Thomas, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 101 days.

(21) Appl. No.: 13/724,218

(22) Filed: Dec. 21, 2012

(65) Prior Publication Data

US 2014/0176190 A1 Jun. 26, 2014

(51) Int. Cl.
*H03K 19/00* (2006.01)
*H03K 19/096* (2006.01)
*G06F 1/10* (2006.01)
*G06F 1/32* (2006.01)

(52) U.S. Cl.
CPC ................ *H03K 19/096* (2013.01); *G06F 1/10* (2013.01); *G06F 1/3203* (2013.01)

USPC .................................. 326/93; 326/21; 326/46

(58) Field of Classification Search
USPC .......................................... 326/21, 46, 93–98
See application file for complete search history.

(56) References Cited

U.S. PATENT DOCUMENTS

| | | | | |
|---|---|---|---|---|
| 6,462,599 | B2 * | 10/2002 | Nitta et al. | 327/292 |
| 6,557,143 | B1 * | 4/2003 | Kitahara et al. | 326/93 |
| 6,636,095 | B2 * | 10/2003 | Nitta et al. | 327/292 |
| 6,864,720 | B2 * | 3/2005 | Kanazawa | 326/93 |
| 7,620,917 | B2 * | 11/2009 | Tian et al. | 716/104 |
| 2004/0021485 | A1 * | 2/2004 | Kanazawa | 326/83 |

* cited by examiner

*Primary Examiner* — Don Le

(57) ABSTRACT

Methods relating to distribution of a clock signal to logic devices of an integrated circuit. The method includes controlling, by a logic element, the distribution of a clock signal by a clock gater and distributing the clock signal by the clock gater to at least one first logic device, wherein the logic element allows the first clock gater to distribute the clock signal only when at least one first logic device requires the clock signal. An integrated circuit configured to perform such a method. Fabrication of such an integrated circuit.

20 Claims, 7 Drawing Sheets

US 8,988,108 B2

COARSE GATING OF CLOCK TREE ELEMENTS

BACKGROUND

1. Technical Field

Generally, the disclosed embodiments relate to integrated circuits, and, more particularly, to improvements in delivery of clock signals to logic devices of an integrated circuit.

2. Description of the Related Art

Integrated circuits require clock signals to regulate and synchronize activities of its various components. Typically, a clock generator generates a clock signal, which it delivers via a clock tree, comprising one or more levels of branches, to individual logic devices or portions of the integrated circuit. Delivering clock signals to all the logic devices of an integrated circuit device typically consumes a significant amount of power, even when individual logic devices, a group of logic devices, or a component comprising multiple groups of logic devices (e.g., a CPU core or a cache unit) are not actively performing operations. For example, the clock tree within a core or a cache unit of a typical modern multicore CPU may consume 150-250 mW regardless of the operations of the core or cache. Unnecessary power consumption by the integrated circuit may lead to increased operating expenses, inconveniences with respect to portable devices, and/or reduced operational lifespan of a device comprising the integrated circuit.

SUMMARY OF EMBODIMENTS

The apparatuses, systems, and methods in accordance with some embodiments may reduce power consumption by an integrated circuit by controlled delivery, via a clock tree, of clock signals to logic devices of the integrated circuit. Mechanisms controlling the delivery of the clock signals may be formed within a microcircuit by any means, such as by growing or deposition.

One apparatus in accordance with some embodiments includes an integrated circuit device, comprising: a clock spine to distribute a clock signal; a first clock gater to receive the clock signal from the clock spine and distribute the clock signal; a logic element for controlling the distribution by the first clock gater; a plurality of second clock gaters, each to receive the clock signal from the first clock gater and distribute the clock signal; and a plurality of first logic devices, wherein each first logic device receives the clock signal from one of the plurality of second clock gaters; wherein the logic element allows the first clock gater to distribute only when at least one first logic device requires the clock signal.

One method in accordance with some embodiments comprises: distributing a clock signal by a clock spine; receiving the clock signal by a first clock gater; distributing the clock signal by the first clock gater; receiving the clock signal by a plurality of second clock gaters; distributing the clock signal by a second clock gater; and receiving the clock signal by a plurality of first logic devices, wherein each said first logic device is configured to receive the clock signal from the second clock gater; wherein distribution by the first clock gater is performed only if at least one first logic device requires the clock signal, and wherein distribution by the second clock gater is performed only if at least one first logic device configured to receive the clock signal from the second clock gater requires the clock signal.

The disclosure described herein may be used in any type of integrated circuit that uses a clock tree to provide a clock signal to a plurality of logic devices. One example is a general purpose microprocessor.

BRIEF DESCRIPTION OF THE FIGURES

The disclosed subject matter will hereafter be described with reference to the accompanying drawings, wherein like reference numerals denote like elements, and.

Figure 1:
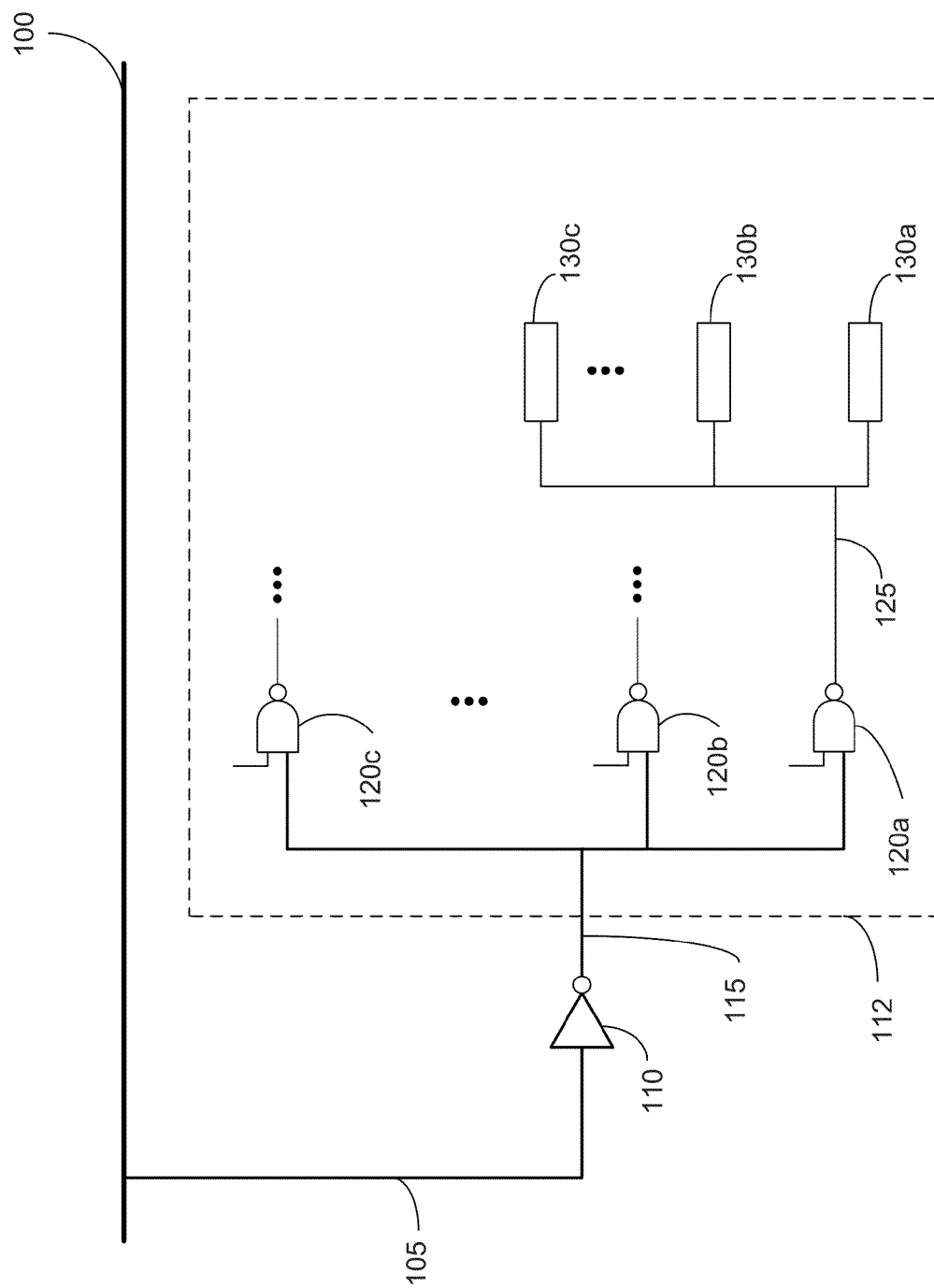
FIG. 1 is a simplified schematic diagram of a microcircuit design known in the art

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

Some embodiments provide for controlled delivery, via a clock tree, of clock signals to logic devices of an integrated circuit. By doing so, if logic devices served by a particular branch of the clock tree do not require a clock signal, delivery of the clock signal to that branch may be restricted or turned off until at least one of the logic devices requires a clock signal. By not delivering unneeded clock signal, power consumption by the integrated circuit may be reduced, thereby reducing operating expenses and heat generation by the integrated circuit.

Turning now to FIG. 1, a block diagram representation of components of an integrated circuit receiving a clock signal from a clock spine 100, as known, is illustrated. The clock spine 100 distributes a clock signal from a clock generator (not shown), via a clock tree branch 105, to a non-gating clock device, e.g., inverter 110. Other non-gating clock devices may be used. The non-gating clock device further distributes the clock signal via a clock tree branch 115 to a plurality of clock gaters 120, e.g., a first NAND gate 120a, a second NAND gate 120b, through an nth NAND gate 120c. The clock gaters 120 are located within a region 112 of the integrated circuit. Other clock gaters may be used. As illustrated in FIG. 1, the NAND gate 120a receives the clock signal and further input relating to the need for a clock signal by logic devices 130. If the clock signal is needed, the NAND gate 120a further distributes the clock signal via a clock tree branch 125 to logic devices 130a, 130b, 130c. The logic devices 130 may each be a floating point logic device, a fixed point logic device, an integer logic device, a CTL logic device, a FPRF logic device, or a cache logic device. Multiple types of the listed logic devices may be present among the logic devices 130.

In some embodiments, one or more non-gating clock devices (e.g., one or more inverters, among others) may be present in clock tree branch 115 between inverter 110 and clock gaters 120. See, for example, FIG. 5, inverters 520.

The prior art lacks more fine-point control of clock signals for finer restriction of clock signals when a clock signal is not required for a particular region. The prior art also lacks any gating of the clock signal prior to branching of the clock tree to clock gaters 120.

Figure 2:
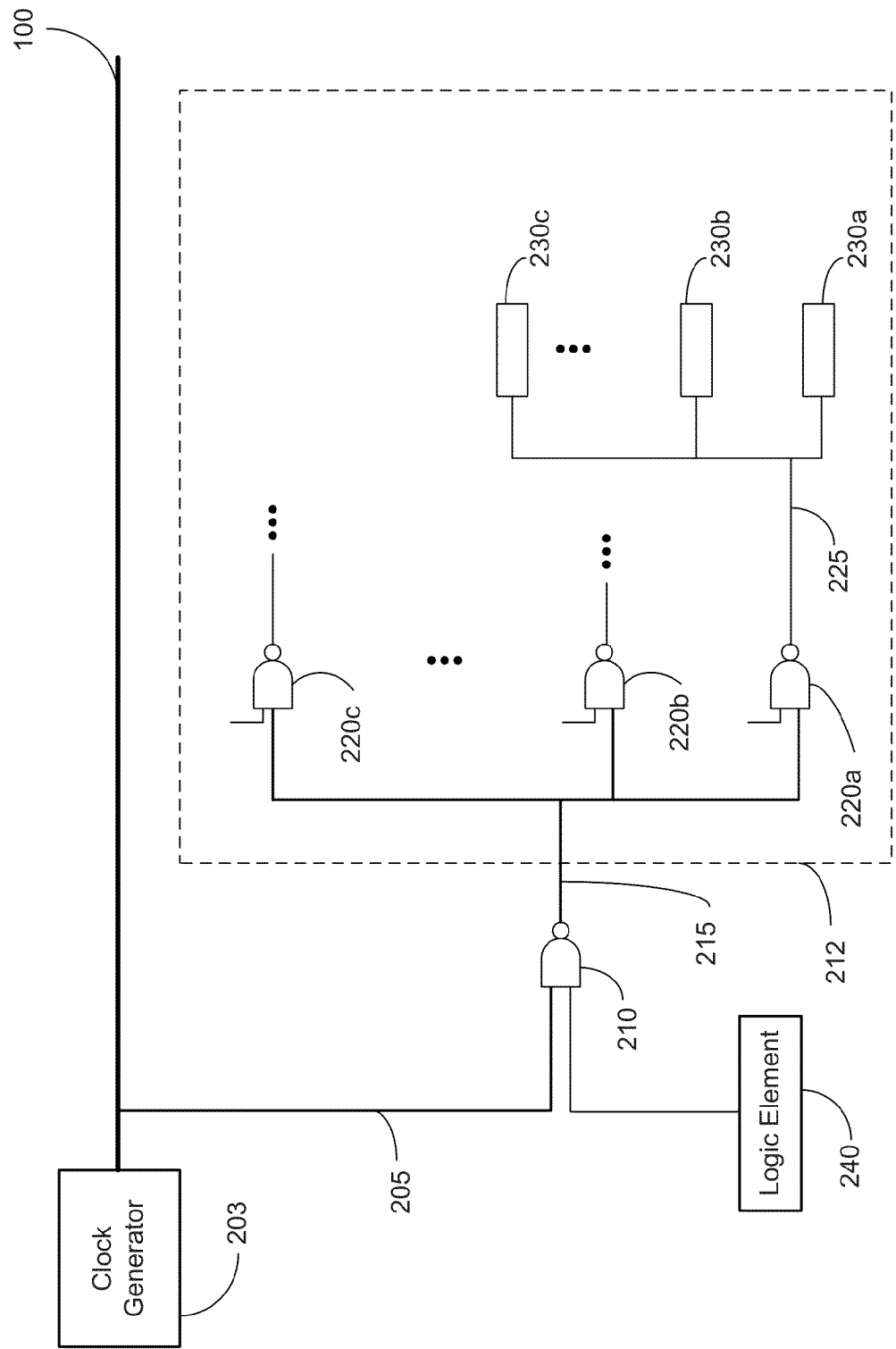
FIG. 2 is a simplified schematic diagram of a microcircuit design, in accordance with some embodiments.

Turning now to FIG. 2, a block diagram representation of components of a computer system receiving a clock signal from a clock spine 100, according to some embodiments, is illustrated. The clock spine 100, from a clock generator 203, distributes a clock signal from a clock generator (not shown), via a clock tree branch 205, to a first gating clock device 210, e.g., a NAND gate. The clock generator 203 may be internal or, alternatively, external to the computer system. Other first gating clock devices 210 may be used. The first gating clock device 210 receives the clock signal and further input (from logic element 240) relating to the need for a clock signal by at least one logic device located within a region 212 of the integrated circuit. Only if such need exists, the first gating clock device 210 further distributes the clock signal via a clock tree branch 215 to a plurality of second clock gaters 220, e.g., a first NAND gate 220a, a second NAND gate 220b, through an nth NAND gate 220c. In some embodiments, the ratio of first clock gater to second clock gaters is 1:4. However, these ratios may vary but still remain within the spirit and scope of various embodiments. The clock gaters 220 are located within the region 212. Other clock gating devices may be used.

As illustrated in FIG. 2, the NAND gate 220a receives the clock signal and further input relating to the need for a clock signal by logic devices 230. If the clock signal is needed by at least one of the logic devices 230, the NAND gate 220a further distributes the clock signal via a clock tree branch 225 to logic devices 230, e.g. a first logic device 230a, a second logic device 230b, through an nth logic device 230c. The logic devices 230 may each be a floating point logic device, a fixed point logic device, an integer logic device, a CTL logic device, a FPRF logic device, or a cache logic device. Multiple types of the listed logic devices may be present among the logic devices 230.

In some embodiments, one or more non-gating clock devices (e.g., one or more inverters, among others) may be present in clock tree branch 215 between first gating clock device 210 and second clock gaters 220 and/or logic devices 230. See, for example, FIG. 5, inverters 530.

In some embodiments, the region 212 of the integrated circuit may be a discrete region, particularly, a region 20 μm×20 μm, for example.

Figure 3:
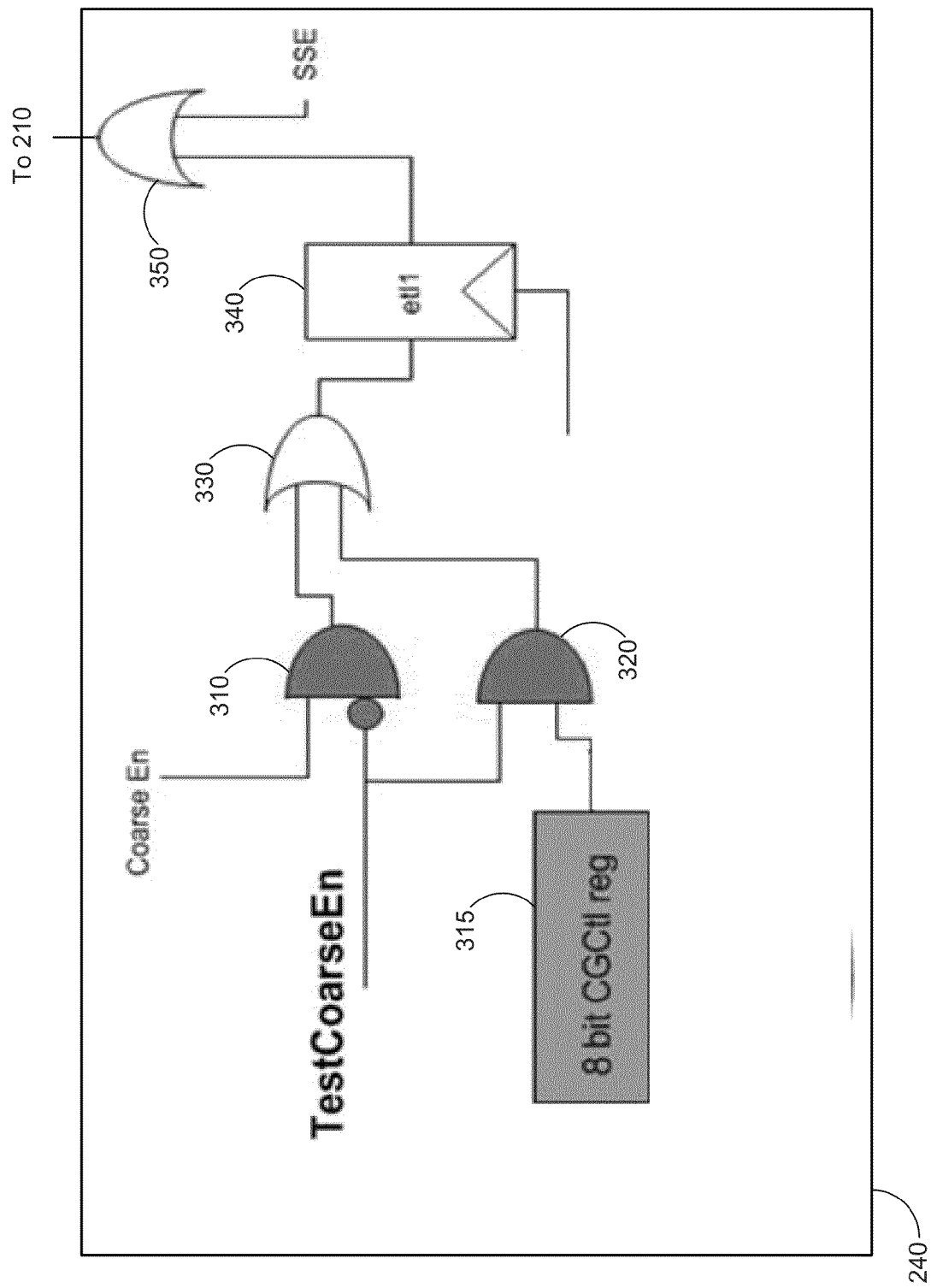
FIG. 3 is a simplified schematic diagram of a logic element for use in the microcircuit design depicted in FIG. 2, in accordance with some embodiments.

FIG. 3 shows a logic element 240 in accordance with some embodiments in more detail. A coarse clock enable (Coarse En) signal and an inverted coarse clock test enable (TestCoarseEn) signal are provided to an AND gate 310, and the TestCoarseEn signal and an (optional) regulatory signal from an 8-bit coarse gater control regulator 315 (e.g., an 8-bit CGCtl reg) are provided to an AND gate 320. The outputs of AND gates 310 and 320 are provided to an OR gate 330. Thereafter, the output of OR gate 330 is provided to a clocked register 340, which provides output to OR gate 350. The OR gate 350 can also receive a scan shift enable (SSE) signal for use in testing the integrated circuit. Therefore, depending upon the assertions and de-assertions of the TestCoarseEN and CoarseEn signals, the regulatory signal from the gator control regulator and the scan shift enable signal may be shifted through the logic element 240 for controlling the first clock gating device 210 (of FIG. 2).

Figure 4:
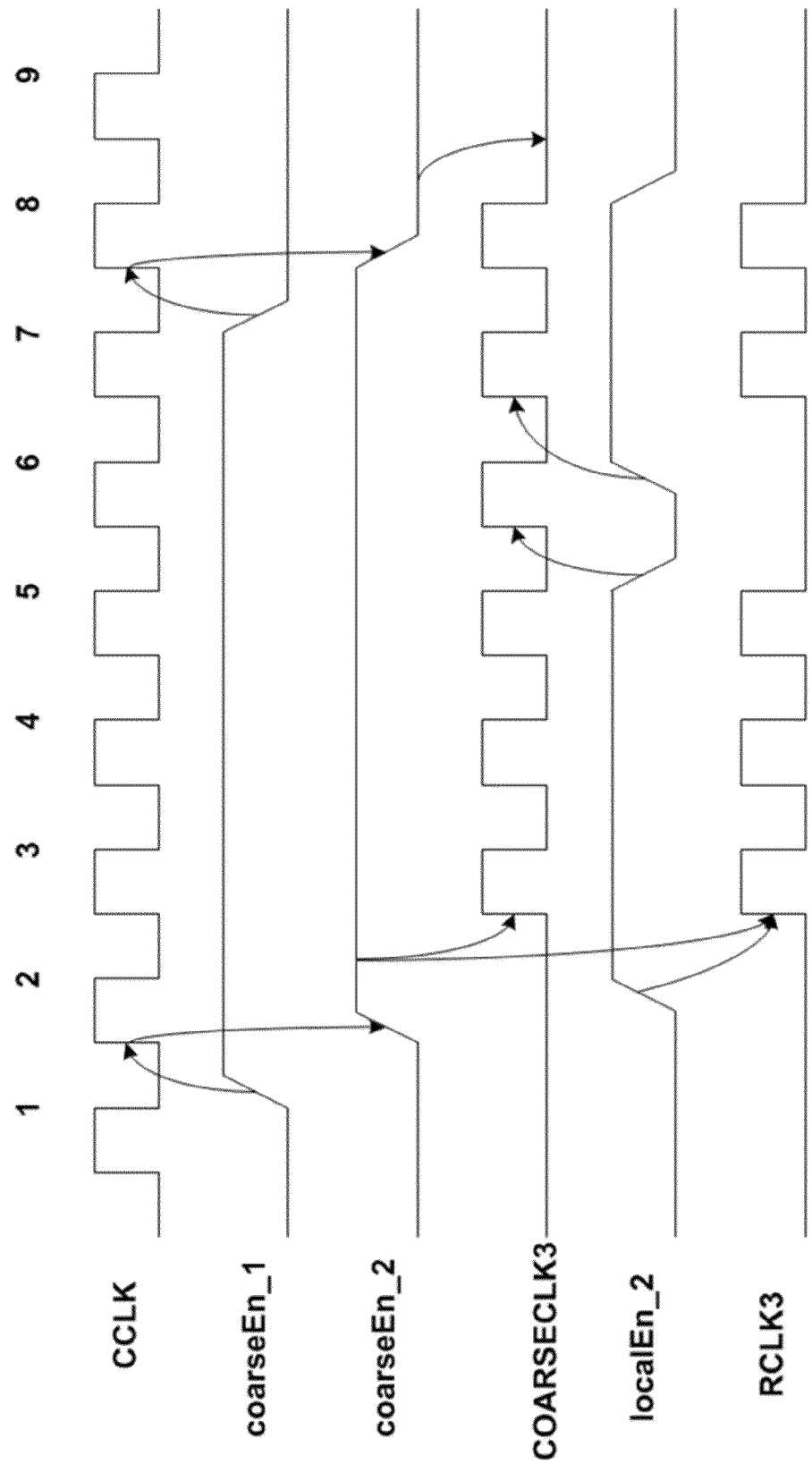
FIG. 4 is a timing diagram, in accordance with some embodiments.

Turning to FIG. 4, a timing diagram of various clock signals in accordance with some embodiments is shown. The operation of the logic element 240 controls the clock provided to logic elements 230 two clock cycles later, e.g., the CCLK signal on at cycle 1 results in a COARSECLK3 signal on at cycle 3. If a local clock is enabled by a second clock gating device 220 (localEn_2), then RCLK3 signal is also on at cycle 3, but is terminated when localEn_2 off (e.g. RCLK3, cycle 6).

Figure 5:
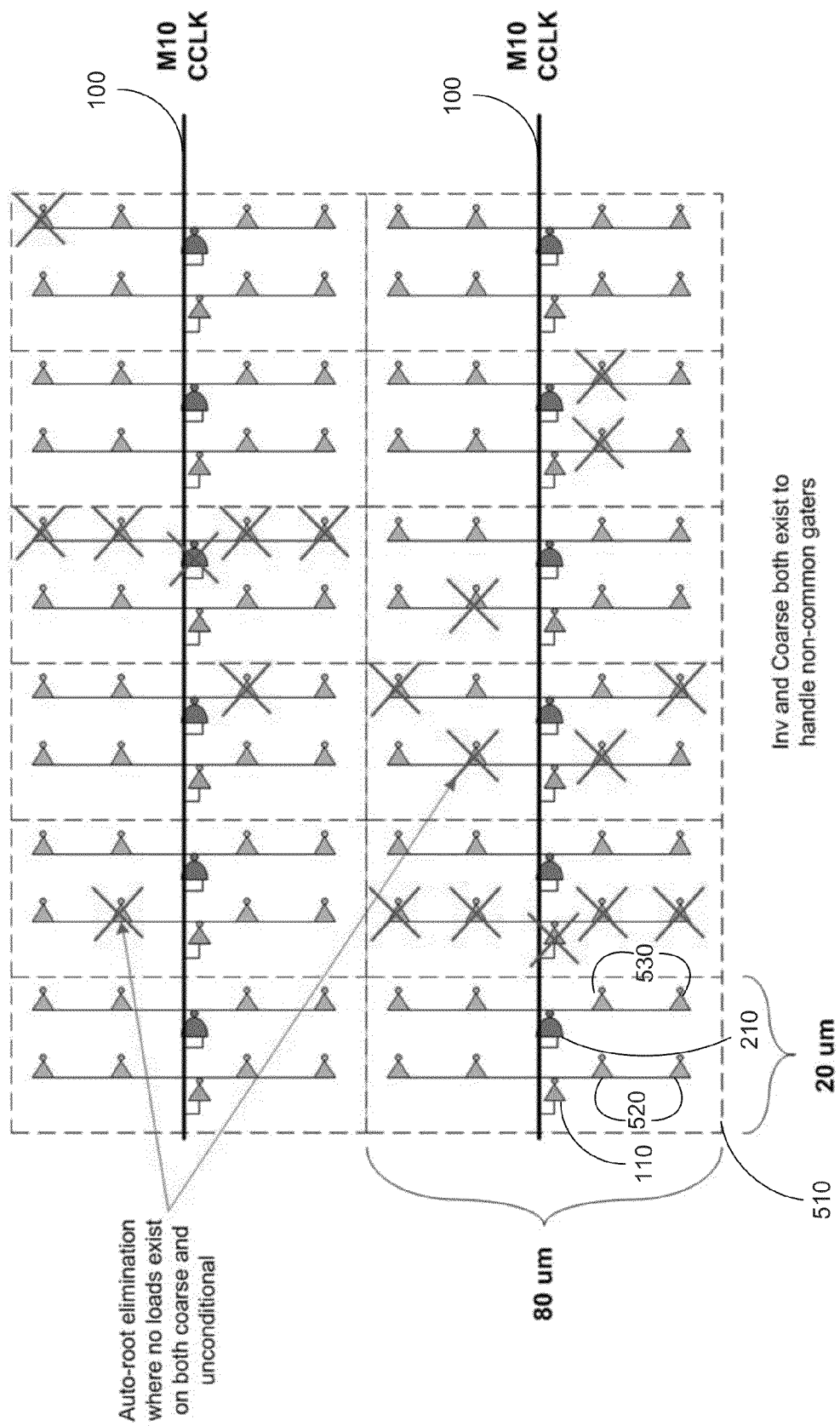
FIG. 5 is a simplified floorplan of a microcircuit design, in accordance with some embodiments.

FIG. 5 shows a floorplan of a portion of an integrated circuit device in accordance with some embodiments. The portion contains a plurality of discrete superregions. In some embodiments, superregions 510 are 80 μm×20 μm, each comprising four of the 20 μm×20 μm regions 212 discussed above. Each superregion 510 is served by an inverter 110 and a first gating clock device 210, with each handling non-common gating devices 120 and 220 (FIGS. 1 and 2) via non-gating clock devices, e.g., inverters 520 and 530. One inverter 520 and one inverter 530 may serve a single region 212.

The floorplan shown in FIG. 5 allows automatic root elimination where no loads exist on the unconditional clock branch comprising inverters 110 and 520, the gated clock branch comprising first gating clock device 210 and inverters 530, or both. The elimination may be affected at either level, e.g. at inverter 110, first gating clock device 210, or at inverters 520 or 530. FIG. 5 illustrates several inverters crossed over by "X," indicating that automatic elimination of clock signal flow is performed to reduce the possibility of routing clock signals to an area where no load exists. This automatic elimination may result in energy savings during operation of the integrated circuit, such as energy savings of about 5-10%.

Figure 6:
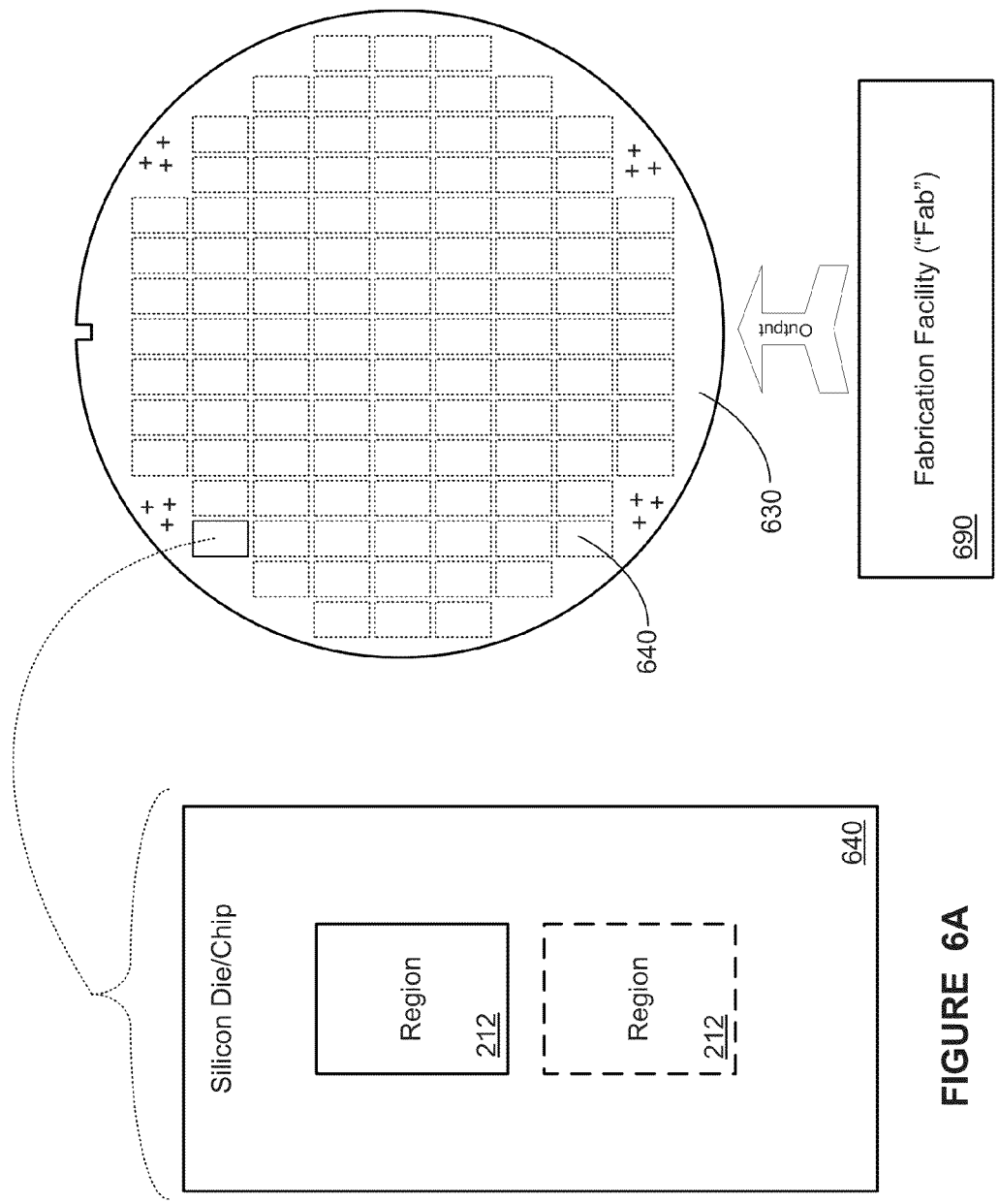
FIG. 6A provides a representation of a silicon die/chip that includes one or more circuits as shown in FIG. 2, in accordance with some embodiments.
FIG. 6B provides a representation of a silicon wafer which includes one or more dies/chips that may be produced in a fabrication facility, in accordance with some embodiments.

Turning now to FIG. 6A, in some embodiments, the region 212 of the integrated circuit device may reside on a silicon die/chip 640. The silicon die/chip 640 may be housed on a motherboard or other structure of a computer system. In some embodiments, there may be more than one region 212 on each silicon die/chip 640. The integrated circuit device may be used in a wide variety of electronic devices.

Turning now to FIG. 6B, in accordance with some embodiments, and as described above, the integrated circuit device may be included on the silicon chip/die 640. The silicon chip/die 640 may contain one or more different configurations of the integrated circuit device. The silicon chip/die 640 may be produced on a silicon wafer 630 in a fabrication facility (or "fab") 690. That is, the silicon wafer 630 and the silicon die/chip 640 may be referred to as the output, or product of, the fab 690. The silicon chip/die 640 may be used in electronic devices.

The circuits described herein may be formed on a semiconductor material by any known means in the art. Forming can be done, for example, by growing or deposition, or by any other means known in the art. Different kinds of hardware descriptive languages (HDL) may be used in the process of designing and manufacturing the microcircuit devices. Examples include VHDL and Verilog/Verilog-XL. In some embodiments, the HDL code (e.g., register transfer level (RTL) code/data) may be used to generate GDS data, GDSII data and the like. GDSII data, for example, is a descriptive file format and may be used in some embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in some embodiments, may be used to configure a manufacturing facility (e.g., through the use of mask works) to create devices capable of embodying some embodiments. As understood by one or ordinary skill in the art, it may be programmed into a computer, processor, or controller, which may then control, in whole or part, the operation of a semiconductor manufacturing facility (or fab) to create semiconductor products and devices. These tools may be used to construct some embodiments described herein.

Figure 7:
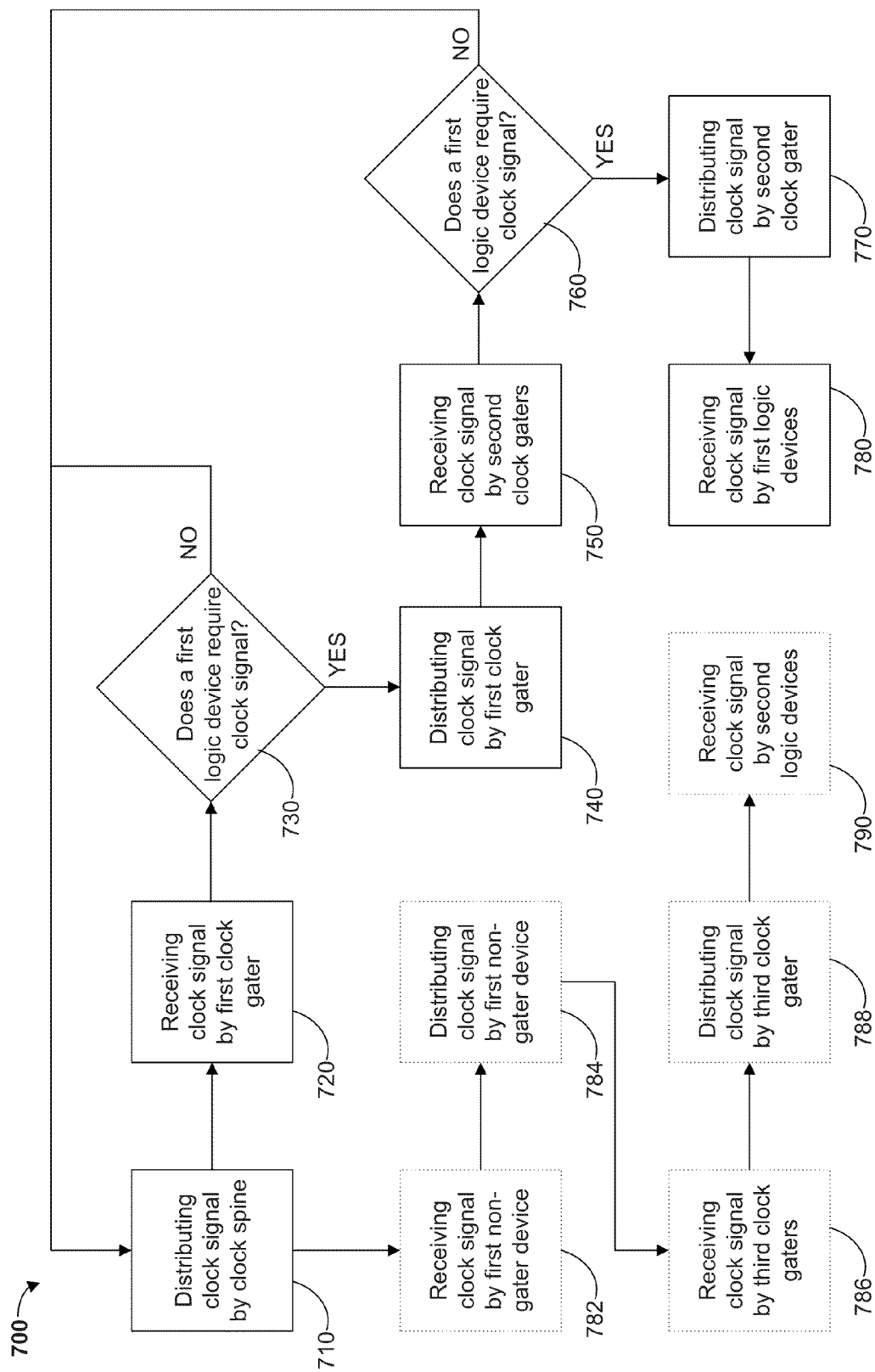
FIG. 7 is a flowchart of a method relating to distribution of a clock signal, in accordance with some embodiments.

It should be borne in mind that fabrication an integrated circuit comprising the components depicted in FIG. 2 can be readily performed with run-to-run variances in location that are within generally accepted tolerances in the art of integrated circuit fabrication. Of interest is the observation that an integrated circuit comprising the components depicted in FIG. 2 can be fabricated to have low-skew/low-insertion-delay clock trees by automated placement and routing techniques known in the fabrication art FIG. 7 presents a flowchart depicting a method 700 according to some embodiments. In the depicted embodiment, the method 700 may comprise: distributing at 710 a clock signal by clock spine 100; and receiving at 720 the clock signal by first clock gater 210. If at least one first logic device 230a, 230b, 230c served by portions of the clock tree branching from the first clock gater requires the clock signal, as determined at 730, the method may comprise: distributing at 740 the clock signal by the first clock gater 210; and receiving at 750 the clock signal by a plurality of second clock gaters 220a, 220b, 220c. If at least one first logic device 230a, 230b, 230c served by portions of the clock tree branching from a second clock gater 220 requires the clock signal, as determined at 760, the method may comprise distributing at 770 the clock signal by one of the second clock gaters 220; and receiving at 780 the clock signal by a plurality of first logic devices 230a, 230b, 230c, wherein each the first logic device 230a, 230b, 230c is configured to receive the clock signal from the second clock gater 220.

In some embodiments, the method 700 may further comprise receiving at 782, from the clock spine 100, the clock signal by a first non-gating clock device 110; distributing at 784 the clock signal by the first non-gating clock device 110; receiving at 786 the clock signal by a plurality of third clock gaters, e.g., inverters 520; distributing at 788 the clock signal by one of the third clock gaters, e.g., an inverter 520; and receiving at 790 the clock signal by a plurality of second logic devices 130a, 130b, 130c. The distributing at 788 need only be performed if at least one of the plurality of second logic devices 130a, 130b, 130c served by portions of the clock tree branching from the third clock gater, e.g., the inverter 520, requires the clock signal.

The methods illustrated in FIG. 7 may be governed by instructions that are stored in a non-transitory computer readable storage medium and that are executed by at least one processor of an integrated circuit device. Each of the operations shown in FIG. 7 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The disclosed embodiments are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. An integrated circuit device, comprising:
a clock spine to distribute a clock signal;
a first clock gater to receive the clock signal from the clock spine and distribute the clock signal;
a logic element to control the distribution of the clock signal by the first clock gater;
a plurality of second clock gaters, each to receive the clock signal from the first clock gater and distribute the clock signal; and
a plurality of first logic devices, wherein each said first logic device receives the clock signal from one of the plurality of second clock gaters;
wherein the logic element allows the first clock gater to distribute the clock signal only when at least one said first logic device requires the clock signal.

2. The integrated circuit device of claim 1, wherein each of the plurality of second clock gaters distributes only when at least one said first logic devices requires the clock signal.

3. The integrated circuit device of claim 1, further comprising:
a first non-gating clock device to receive the clock signal from the clock spine and to distribute the clock signal;
a plurality of third clock gaters, each to receive the clock signal from the first non-gating clock device and to distribute the clock signal; and
a plurality of second logic devices, wherein each said second logic device receives the clock signal from one of the plurality of third clock gaters.

4. The integrated circuit device of claim 1, wherein the ratio of first clock gater to second clock gaters is 1:4.

5. The integrated circuit device of claim 4, wherein all the first logic devices which receive the clock signal from one second clock gater are located within one discrete region of the integrated circuit device.

6. The integrated circuit device of claim 1, wherein the first logic devices are selected from floating point logic devices, fixed point logic devices, integer logic devices, CTL logic devices, FPRF logic devices, cache logic devices, or two or more thereof.

7. The integrated circuit device of claim 3, wherein the second logic devices are selected from floating point logic devices, fixed point logic devices, integer logic devices, CTL logic devices, FPRF logic devices, cache logic devices, or two or more thereof.

8. A method, comprising:
distributing a clock signal by a clock spine;
receiving the clock signal by a first clock gater;
distributing the clock signal by the first clock gater;
receiving the clock signal by a plurality of second clock gaters;

distributing the clock signal by a said second clock gater; and receiving the clock signal by a plurality of first logic devices, wherein each said first logic device is configured to receive the clock signal from the second clock gater;

wherein the distributing by the first clock gater is performed only if at least one first logic device requires the clock signal, and wherein the distributing is performed by one said second clock gater only if at least one first logic device requires the clock signal.

9. The method of claim 8, further comprising receiving, from the clock spine, the clock signal by a first non-gating clock device;

distributing the clock signal by the first non-gating clock device;

receiving the clock signal by a plurality of third clock gaters;

distributing the clock signal by a said third clock gater; and receiving the clock signal by a plurality of second logic devices.

10. The method of claim 8, wherein the ratio of first clock gater to second clock gaters is 1:4.

11. The method of claim 10, wherein all the first logic devices receiving the clock signal from one second clock gater are located within one discrete region of an integrated circuit device.

12. The method of claim 8, wherein the first logic devices are selected from floating point logic devices, fixed point logic devices, integer logic devices, CTL logic devices, FPRF logic devices, cache logic devices, or two or more thereof.

13. The method of claim 9, wherein the second logic devices are selected from floating point logic devices, fixed point logic devices, integer logic devices, CTL logic devices, FPRF logic devices, cache logic devices, or two or more thereof.

14. A computer readable storage device encoded with data that, when executed by a computer system in a manufacturing facility, adapts the manufacturing facility to create an apparatus, comprising:

a clock spine to distribute a clock signal;

a first clock gater to receive the clock signal from the clock spine and distributing the clock signal;

a logic element to control the distribution of the clock signal by the first clock gater;

a plurality of second clock gaters, each to receive the clock signal from the first clock gater and to distribute the clock signal; and a plurality of first logic devices, wherein each said first logic device receives the clock signal from one of the plurality of second clock gaters;

wherein the logic element is configured to allow the first clock gater to distribute the clock signal only when at least one said first logic device requires the clock signal.

15. The computer readable storage device of claim 14, encoded with data that, when executed by a computer system in a manufacturing facility, adapts the manufacturing facility to create the apparatus, wherein each of the plurality of second clock gaters is configured to distribute only when at least one said first logic device requires the clock signal.

16. The computer readable storage device of claim 14, encoded with data that, when executed by a computer system in a manufacturing facility, adapts the manufacturing facility to create the apparatus, wherein the apparatus further comprises:

a first non-gating clock device to receive the clock signal from the clock spine and distributing the clock signal;

a plurality of third clock gaters, each to receive the clock signal from the first non-gating clock device and distributing the clock signal; and a plurality of second logic devices, wherein each said second logic device receives the clock signal from one of the plurality of third clock gaters.

17. The computer readable storage device of claim 14, encoded with data that, when executed by a computer system in a manufacturing facility, adapts the manufacturing facility to create the apparatus, wherein the ratio of first clock gater to second clock gaters is 1:4.

18. The computer readable storage device of claim 17, encoded with data that, when executed by a computer system in a manufacturing facility, adapts the manufacturing facility to create an apparatus, wherein all the first logic devices receiving the clock signal from one second clock gater are located within one discrete region of an integrated circuit device.

19. The computer readable storage device of claim 14, encoded with data that, when executed by a computer system in a manufacturing facility, adapts the manufacturing facility to create an apparatus, wherein the first logic devices are selected from floating point logic devices, fixed point logic devices, integer logic devices, CTL logic devices, FPRF logic devices, cache logic devices, or two or more thereof.

20. The computer readable storage device of claim 16, encoded with data that, when executed by a computer system in a manufacturing facility, adapts the manufacturing facility to create an apparatus, wherein the second logic devices are selected from floating point logic devices, fixed point logic devices, integer logic devices, CTL logic devices, FPRF logic devices, cache logic devices, or two or more thereof.

* * * * *